(12) United States Patent
Peng (10) Patent No.: US 11,201,163 B2
(45) Date of Patent: Dec. 14, 2021

(54) HIGH-DENSITY NOR-TYPE FLASH MEMORY

(71) Applicant: Haibing Peng, Houston, TX (US)

(72) Inventor: Haibing Peng, Houston, TX (US)

(73) Assignee: Haibing Peng, Houston, TX (US)

( * ) Notice: Subject to any disclaimer, the term of this patent is extended or adjusted under 35 U.S.C. 154(b) by 59 days.

(21) Appl. No.: 15/859,499

(22) Filed: Dec. 30, 2017

(65) Prior Publication Data

US 2019/0206888 A1  Jul. 4, 2019

(51) Int. Cl.
| | |
|---|---|
| *H01L 27/11568* | (2017.01) |
| *H01L 29/78* | (2006.01) |
| *H01L 29/417* | (2006.01) |
| *H01L 29/51* | (2006.01) |
| *H01L 29/792* | (2006.01) |
| *H01L 27/11521* | (2017.01) |
| *H01L 29/788* | (2006.01) |
| *H01L 29/66* | (2006.01) |
| *H01L 21/28* | (2006.01) |
| *H01L 27/11582* | (2017.01) |

(52) U.S. Cl.
CPC .. *H01L 27/11568* (2013.01); *H01L 27/11521* (2013.01); *H01L 27/11582* (2013.01); *H01L 29/40114* (2019.08); *H01L 29/40117* (2019.08); *H01L 29/41791* (2013.01); *H01L 29/513* (2013.01); *H01L 29/517* (2013.01); *H01L 29/518* (2013.01); *H01L 29/66795* (2013.01); *H01L 29/66825* (2013.01); *H01L 29/66833* (2013.01); *H01L 29/7851* (2013.01); *H01L 29/7883* (2013.01); *H01L 29/792* (2013.01)

(58) Field of Classification Search
CPC ......... H01L 27/11568; H01L 27/11521; H01L 29/40114; H01L 29/11582
See application file for complete search history.

(56) References Cited

U.S. PATENT DOCUMENTS

| | | | | | |
|---|---|---|---|---|---|
| 5,414,287 | A | * | 5/1995 | Hong | H01L 27/11556 257/316 |
| 5,874,760 | A | * | 2/1999 | Burns, Jr | H01L 27/10864 257/315 |
| 2002/0028541 | A1 | * | 3/2002 | Lee | G11C 16/3427 438/149 |
| 2006/0231822 | A1 | * | 10/2006 | Kim | H01L 27/115 257/1 |
| 2010/0172183 | A1 | * | 7/2010 | Lue | G11C 16/0466 365/185.18 |
| 2012/0051137 | A1 | * | 3/2012 | Hung | G11C 16/0466 365/185.17 |
| 2013/0270627 | A1 | * | 10/2013 | Cheng | H01L 27/11524 257/326 |
| 2013/0329499 | A1 | * | 12/2013 | Lee | H01L 27/11563 365/185.17 |

OTHER PUBLICATIONS

Excerpt from "Flash memories", by Paulo Cappelletti et al., 1999, Springer Science+Business Media New York. pp. 409-411.

* cited by examiner

*Primary Examiner* — Tuan A Hoang
(74) *Attorney, Agent, or Firm* — Dilworth IP, LLC (57) ABSTRACT

The present invention provides architectures of high-density NOR flash memory consisting of arrays of memory cells (i.e., field effect transistors) with uniquely designed sidewall charge-storage structures to solve the leakage problem typically associated with overerase in traditional NOR flash memory. This feature is particularly useful for applications such as embedded flash memory.

15 Claims, 13 Drawing Sheets

HIGH-DENSITY NOR-TYPE FLASH MEMORY

FIELD OF THE INVENTION

The present invention relates to high-density NOR flash memory devices.

BACKGROUND

Flash memory is a non-volatile computer storage technology, usually using field effect transistor (FET) with a floating gate or a charge trapping structure to store charges. There are two main types of flash memory: NAND type and NOR type. NOR flash memory offers full random access which is needed for executable-code storage. However, the achievable density of NOR flash is currently much smaller than NAND flash, resulting in higher cost. Furthermore, one technical challenge for NOR flash is the overerase issue. Therefore, it is important to realize high-density NOR flash memory without the overerase problem.

SUMMARY OF THE INVENTION

The present invention comprises: (1) architectures of high-density NOR flash memory without the overerase problem, consisting of memory cells (i.e., FETs) with sidewall charge-storage structures; and (2) device fabrication processes to realize such NOR flash memory devices.

BRIEF DESCRIPTION OF THE DRAWINGS

FIG. 1 shows schematically a top view (upper panel) and a cross-sectional view (lower panel) for a basic NOR memory group in which individual memory cells (i.e., FETs) are stacked along a direction parallel to the plane of a substrate and electrically connected in parallel (i.e., sharing the source and drain electrodes, respectively). The Bit Line and the Source Line are connected to the top and the bottom of the conduction channel (a piece of semiconductor, e.g., a Si fin), respectively, and two sets of side-gating structures are stacked along a direction parallel to the substrate plane. For every individual memory cell, the gating structure on each side of the conduction channel consists of two parts: (1) an ONO (Oxide-Nitride-Oxide) charge trap serving as the charge-storage structure and contacting the lower portion of the conduction channel; and (2) an oxide segment serving as conventional gate dielectrics and contacting the upper portion of the conduction channel.

DETAILED DESCRIPTION OF THE INVENTION

The present invention provides NOR flash memory architectures for increasing the storage density and getting rid of the overerase problem associated with typical 1T (one-transistor) NOR flash. The key ideas include: (1) the Bit Line and Source Line are connected to the top and the bottom of the conduction channel (a piece of semiconductor, e.g., a Si fin), respectively, or vice versa; (2) for every individual memory cell, the gating structure on each side of the conduction channel consists of (i) a charge-storage structure such as a charge trap or a floating-gate structure contacting the lower portion of the conduction channel and (ii) a conventional gate dielectrics contacting the upper portion of the conduction channel; and (3) to form a basic NOR memory group, individual memory cells (i.e., FETs) are stacked along a direction parallel to the plane of a substrate and electrically connected in parallel (i.e., sharing the source and drain electrodes, respectively).

Figure 1:
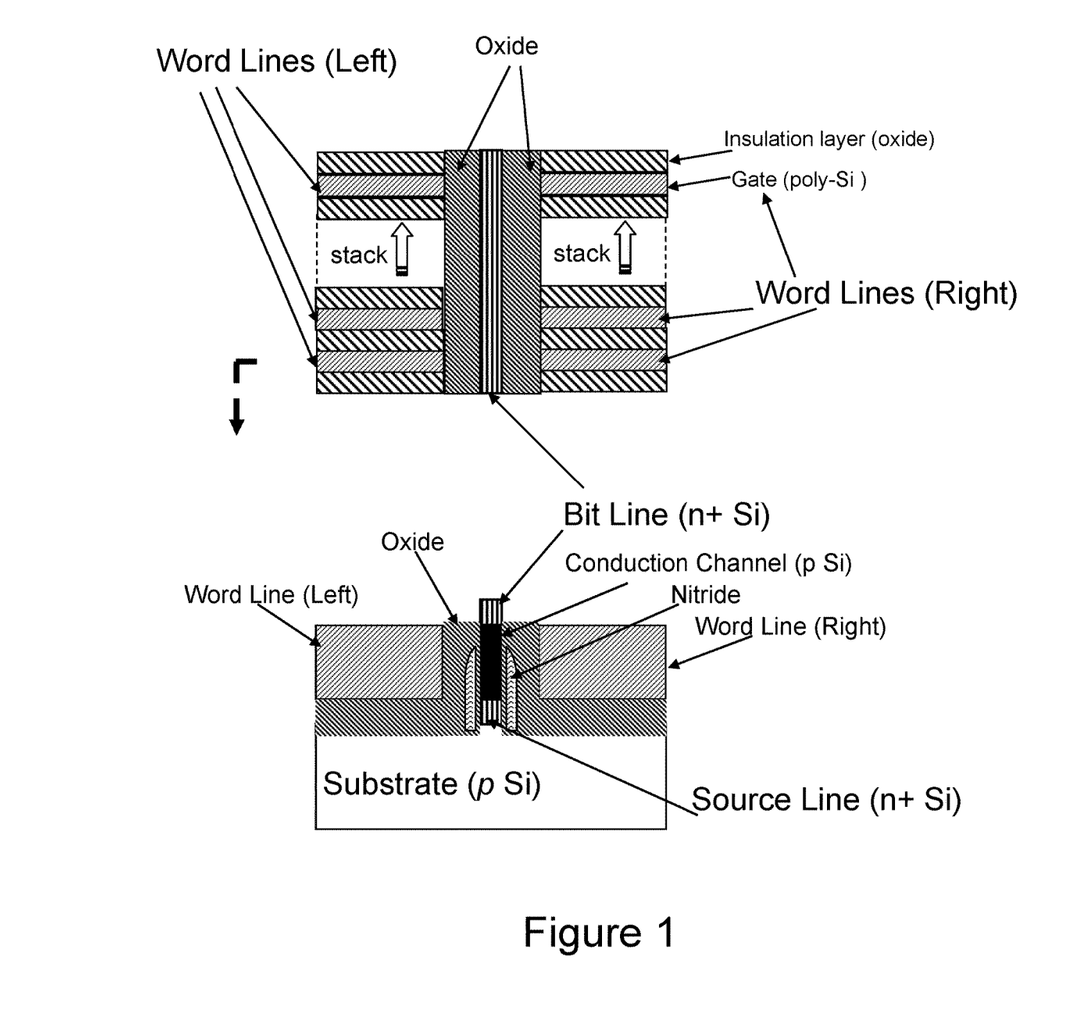

In one embodiment, the present invention comprises a basic NOR memory group in which individual memory cells (i.e., FETs) are stacked along a direction parallel to (or nearly parallel to) the plane of a substrate and electrically connected in parallel (i.e., sharing the source and drain electrodes, respectively), as illustrated in FIG. 1. Here a piece of semiconductor (denoted as a semiconductor "fin") provides parallel conduction channels for all FETs within the same basic NOR memory group; the semiconductor fin (e.g., a fin of Si, or Ge, or Si—Ge alloy) can have a cuboid or other regular/irregular shape, and the direction of electrical current flow is approximately perpendicular to the substrate plane when a FET is in the ON state. The Bit Line (i.e., the drain electrode) and the Source Line are connected to the top and the bottom of the conduction channel (semiconductor fin), respectively, or vice versa; and the Bit/Source line is made of heavily doped semiconductor. Two sets of side-gating structures are stacked along a direction parallel to the substrate plane, following the conduction channel (semiconductor fin). For every individual FET, the gating structure at each side includes: (i) a gate (Word Line) which is made of heavily doped poly-Si (or alternatively other conductors such as metal); (ii) a charge trap structure contacting the lower portion of the conduction channel; and (iii) a conventional gate dielectrics contacting the upper portion of the conduction channel. The charge trap structure can be preferably the ONO sandwich structure including a tunneling dielectric layer (proximate to the conduction channel) such as silicon oxide (O), a charge-retention spacer layer such as silicon nitride (N), and a blocking dielectric layer (proximate to the gate) such as silicon oxide (O). The lower panel of FIG. 1 shows a silicon nitride spacer layer which serves as the charge retention medium; while the conventional gate dielectrics at the upper segment is silicon oxide. Alternatively, the charge trap structure can be a bandgap engineered ONO structure with a tunneling dielectric layer comprising composite materials of sandwiched ultra-thin silicon oxide/silicon nitride/silicon oxide structure to assist electron tunneling, a charge-retention spacer layer such as silicon nitride, and a blocking dielectric layer such as silicon oxide. In another alternative configuration, the charge trap structure can be a dielectric multilayer, such as $Al_2O_3$ layer/silicon nitride spacer/silicon oxide layer, or $H_fO_2$ layer/silicon nitride spacer/$H_fO_2$ layer sandwich structure, where a silicon nitride spacer functions as the trap for charge retention inside the dielectrics. To function as NOR gate logics in reading scheme, the doping configurations of the conduction channel (taking Si fin as an specific example) and the Source and Bit Lines (taking heavily doped Si as an example) are preferred to be as follows (in the case that an inversion layer serves as the electrical conduction path in the FET ON state): (i) the channel is p-doped Si while the Source and Bit Lines are heavily n-doped Si; or (ii) the channel is n-doped Si while the Source and Bit Lines are heavily p-doped Si. In the case that an accumulation layer serves as the electrical conduction path in the FET ON state, the channel can be a resistive undoped Si while the Source and Bit Lines are heavily doped Si with either type of carrier. A basic requirement of workable doping configurations of the conduction channel and the Source/Bit line electrodes is to ensure that there should be no conduction path between the source and the drain electrodes when all FETs within the same basic memory group are in the OFF state. A plurality of basic NOR memory groups of FIG. 1 can be connected in arrays on chip to form NOR flash memory devices.

In an alternative embodiment of the present invention, the charge trap structure in the basic NOR memory group of FIG. 1 can be replaced by a floating gate structure. For example, the silicon nitride spacer of FIG. 1 can be replaced by an isolated poly-Si spacer (i.e., floating gate) as the charge retention medium; the blocking dielectric layer between the charge retention medium and the gate (Word Line) can consist of an ONO structure (i.e. silicon oxide/silicon nitride/silicon oxide); and the conventional gate dielectrics at the upper segment can also be changed to an ONO structure accordingly.

In another embodiment of the present invention, the structure of the conduction channel in the basic NOR memory group of FIG. 1 can be configured alternatively: the conduction channel can be a fin consisting of alternating lightly/heavily doped semiconductor segments (e.g., p Si/p+ Si) or alternating doped-semiconductor/insulator segments (e.g., doped-Si/SiO$_2$) stacked along a direction parallel to (or nearly parallel to) the plane of the substrate, which are aligned with the corresponding gate/insulator stacks, respectively, to form isolated parallel conduction channels between the Source and Bit Line.

In another embodiment of the present invention, the Bit/Source lines can be made of conducting materials such as metals and alloys, including but not limited to: tungsten (W), titanium (Ti), nickel (Ni), cobalt (Co), tungsten silicide, titanium silicide, nickel silicide, and cobalt silicide.

In another alternative embodiment, the semiconductor fin (conduction channel) in the basic NOR memory group of FIG. 1 can be split into two pieces (a left and a right piece) to decouple the left-side gate and the right-side gate. The space between the separated two pieces of semiconductor channel can be filled with insulation layer and thus the coupling effect of the left-side gate and the corresponding right-side gate is reduced.

In another alternative embodiment, the present invention comprises other basic NOR memory groups similar to that of FIG. 1, but wherein the stacking direction of individual memory cells (i.e., FETs) can be changing (e.g., along meandering directions parallel to or nearly parallel to the plane of the substrate) and the exact shape of the conduction channel (e.g., a Si fin) can be varied as long as the cells are electrically connected in parallel (i.e., sharing the source and drain electrodes, respectively) to implement NOR gate logic.

In an alternative configuration, these two side-gates for the basic NOR memory group of FIG. 1 or its aforementioned alternative embodiments can be connected to form a single gate. In another alternative configuration, the aforementioned basic NOR memory groups can be modified so that only part of the left-side and/or right-side gates are presented.

Using typical read/program/erase schemes for NOR flash memory, full random access to every individual memory cell in the basic NOR memory group of FIG. 1 can be implemented. Programming/erasing can be done either on just one individual memory cell, or in parallel on any number of selected memory cells in a basic NOR memory group, similar to what was described in U.S. patent application Ser. No. 14/860,697 (filing date: Sep. 21, 2015; applicant: Haibing Peng).

A unique feature of the basic NOR memory group of FIG. 1 or its aforementioned alternative embodiments of the present invention is that the overerase issue is solved by employing the gating effect via the conventional gate dielectrics contacting the upper part of the conduction channel. Therefore, even if a memory cell is over erased, the gating effect via the conventional gate dielectrics is still sufficient to turn off the conduction channel, thus avoiding unwanted leakage current from unselected cells during read process. This feature is particularly useful for applications such as embedded flash memory.

In other alternative embodiments of the present invention, the charge trap structure or floating gate structure of the basic NOR memory group of FIG. 1 and its aforementioned alternative embodiments can be configured to contact a fraction of the conduction channel at any position(s), e.g., at the upper portion or a middle portion, while conventional gate dielectrics can be configured to contact the rest part(s) of the conduction channel.

Figure 2A:
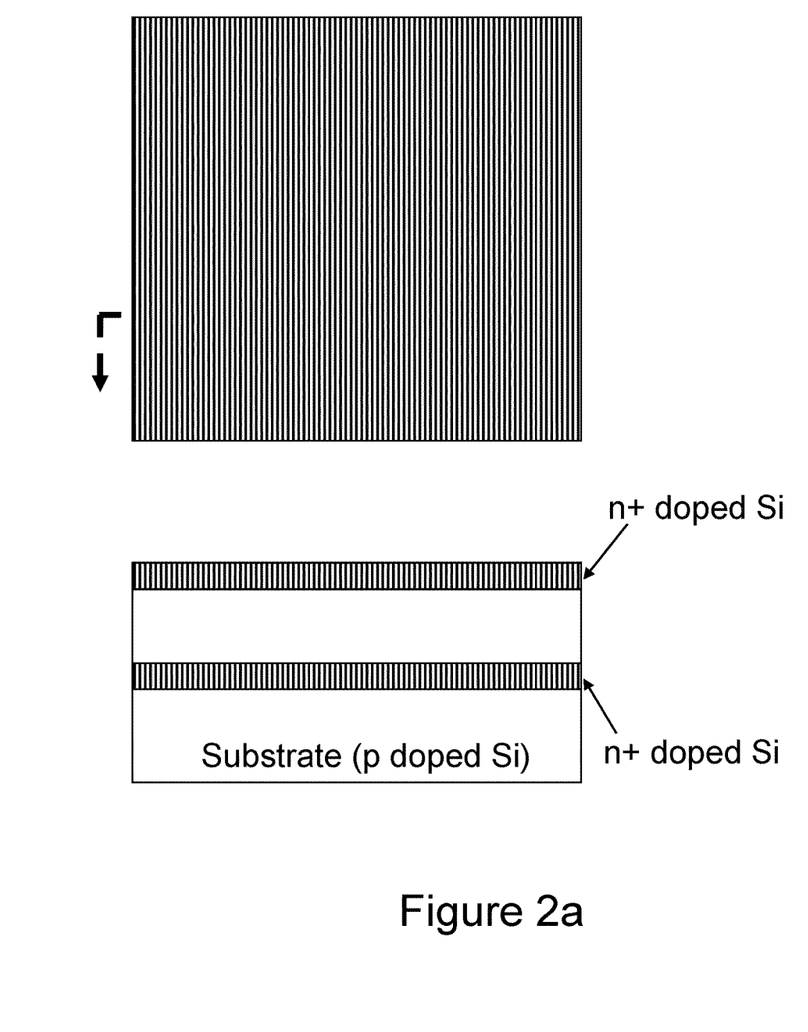
FIGS. 2a-2f show schematic diagrams of an example fabrication process for using a bulk Si wafer to implement a NOR flash memory device consisting of arrays of the basic NOR memory group of FIG. 1. The top view (upper panel) and cross-sectional view (lower panel) of the device at different fabrication stages are presented. In this design, the left-side and right-side gates of each basic NOR memory group are electrically connected.
Figure 2B:
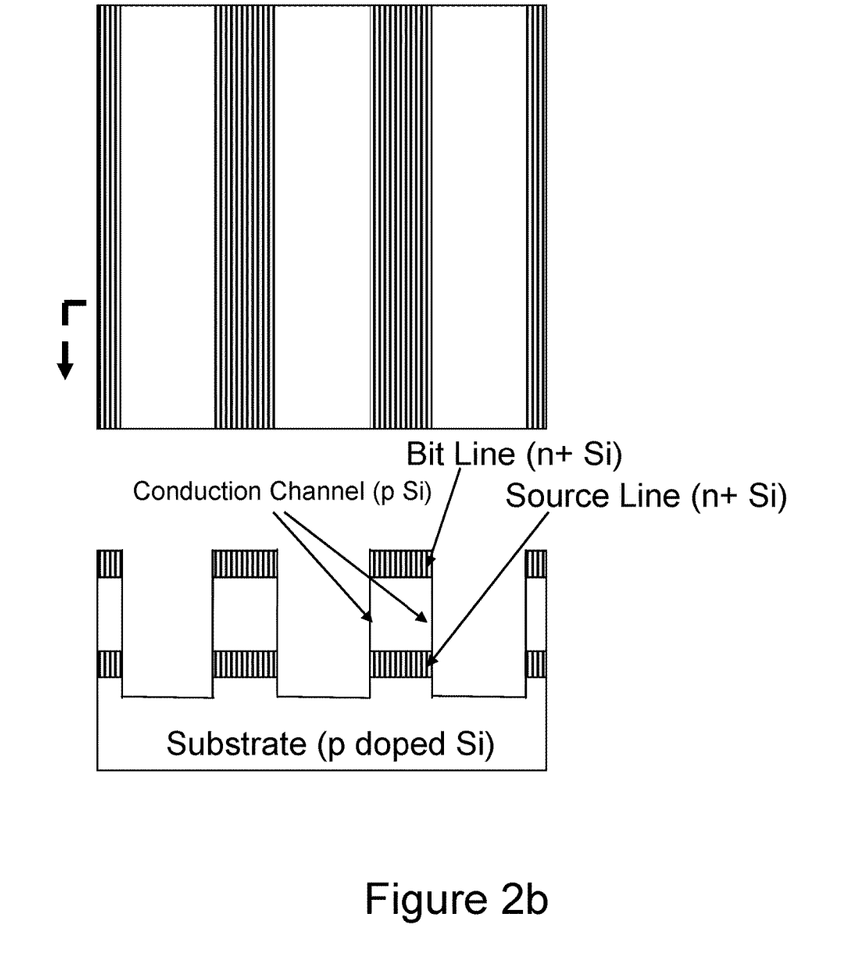
Figure 2C:
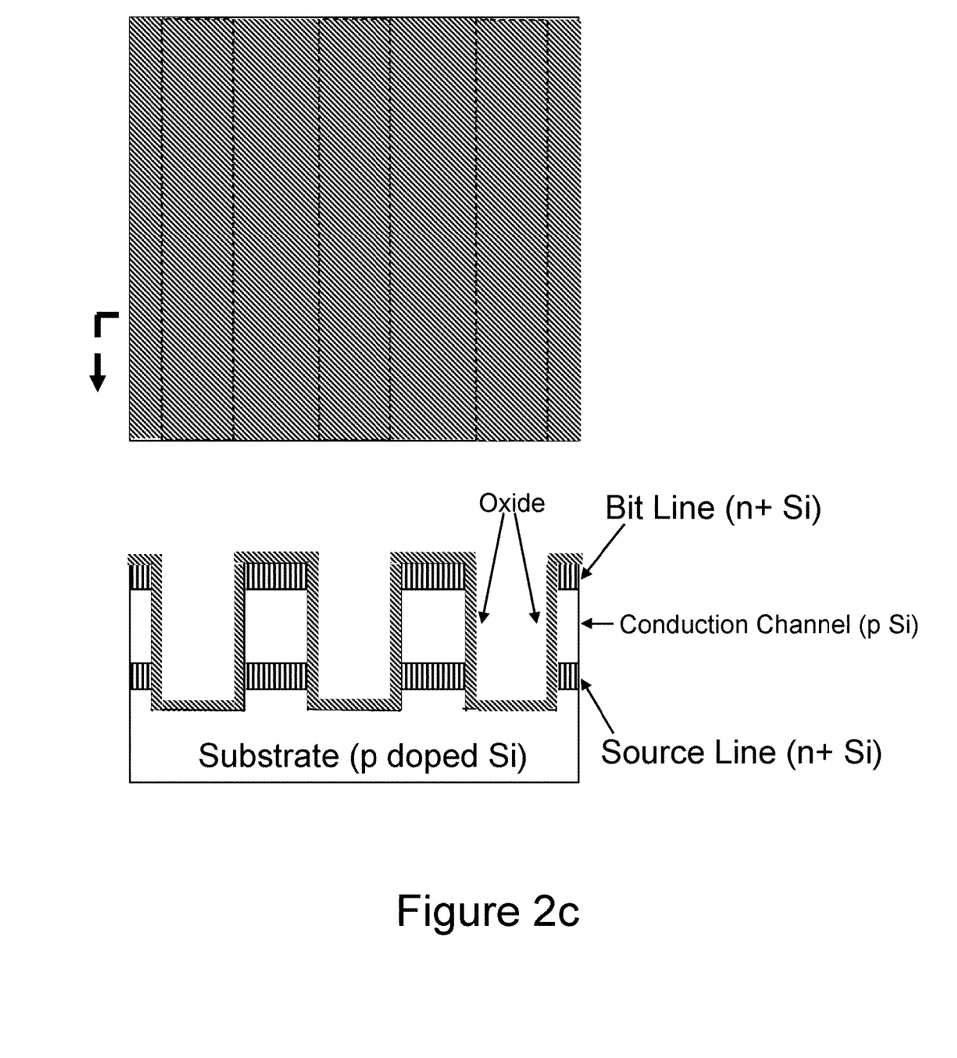
Figure 2D:
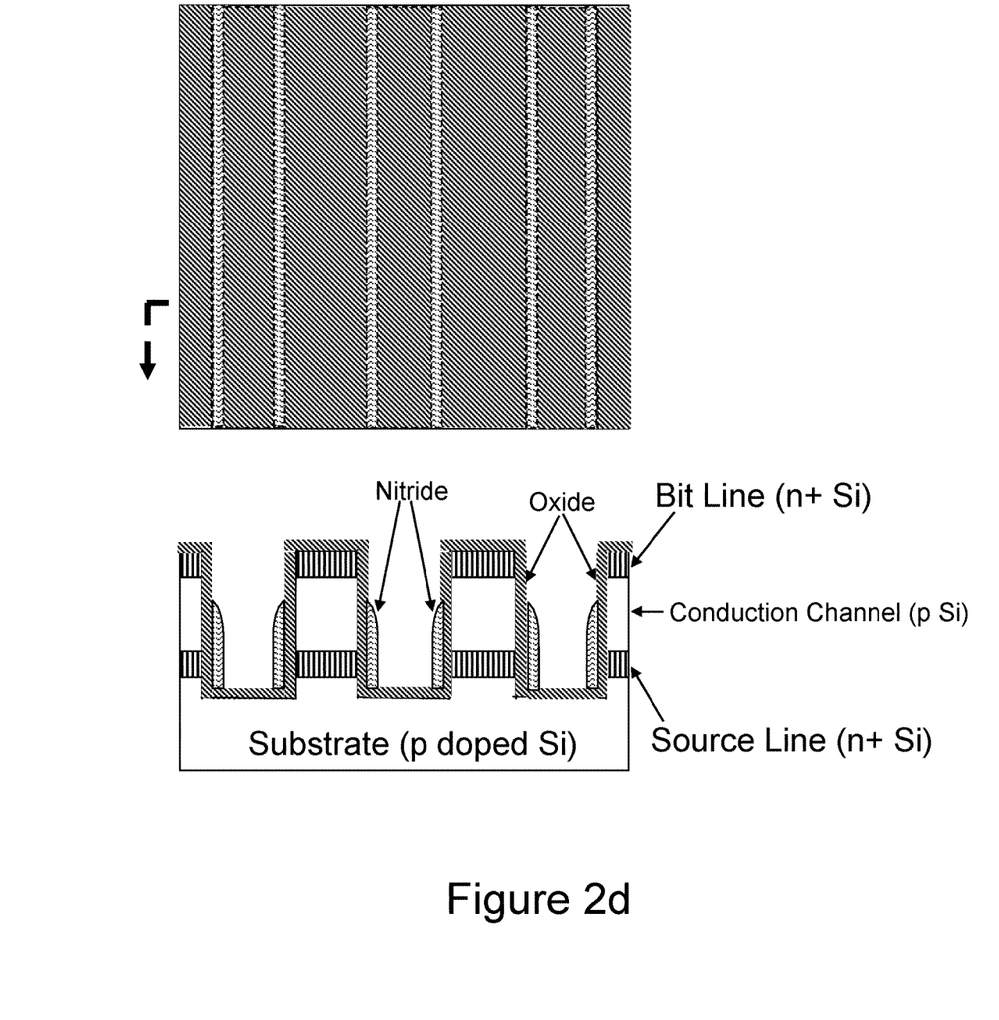
Figure 2E:
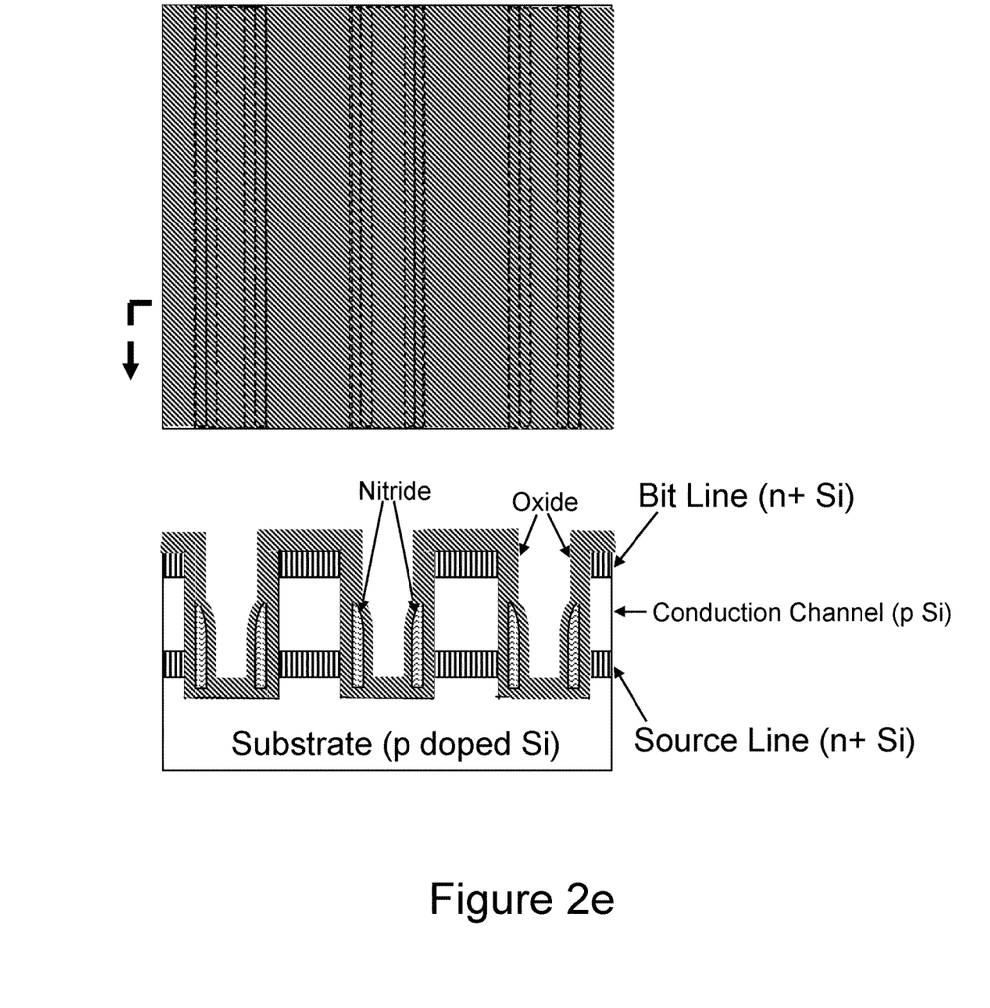
Figure 2F:
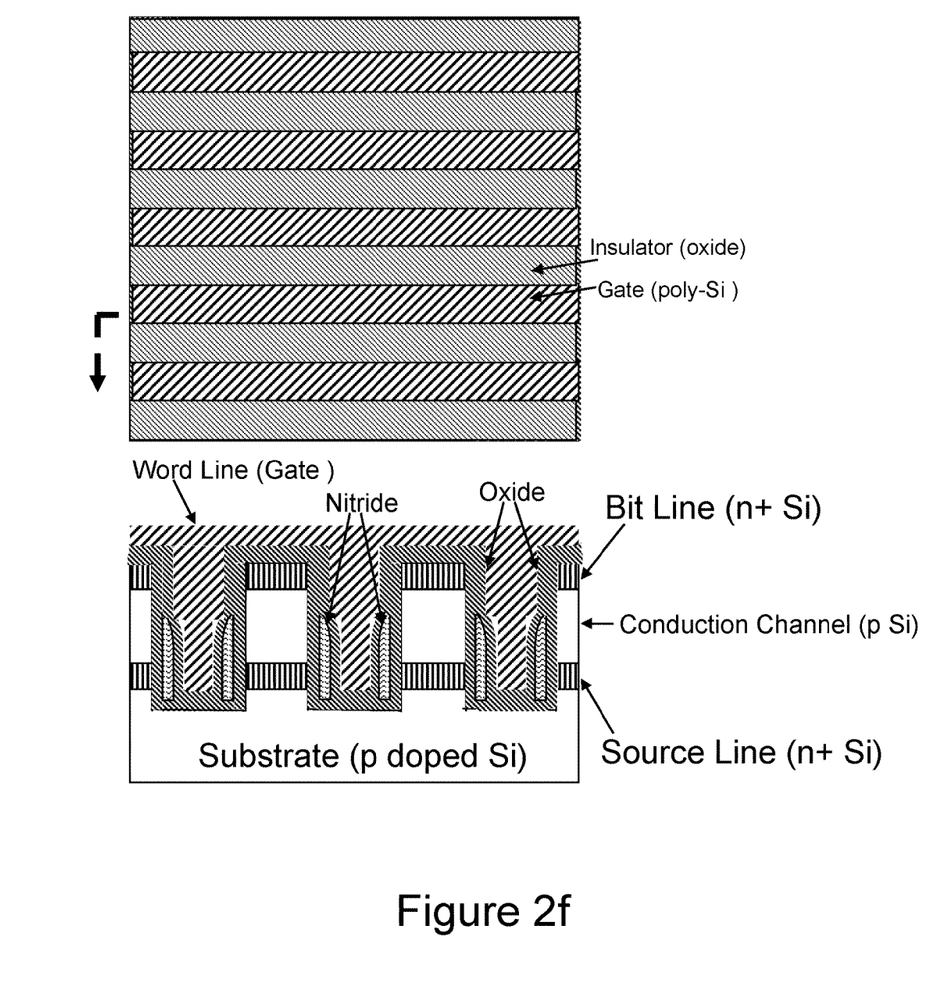

In some embodiments, the present invention comprises device fabrication methods for using a bulk Si wafer to implement a NOR flash memory device consisting of arrays of the basic NOR memory group of FIG. 1. FIGS. 2a-2f illustrate an example fabrication process using a p-doped Si wafer. First, one can start with a p-doped Si wafer and form two layers of n+ doped Si (FIG. 2a) via ion implantation and rapid thermal annealing (in an alternative example fabrication process, one can also form two p+ doped Si layers in a n-doped Si wafer). Additionally, an optional layer of silicide (e.g. tungsten silicide, cobalt silicide, titanium silicide) can be formed over the top layer of the n+ doped Si. Alternatively, the structure of FIG. 2a can also be produced by epitaxial growth of n+ Si/p Si/n+ Si tri-layers on top of a p-doped Si wafer. The thickness of the n+ Si and p Si layer can be from 1 nm to a few µm, but the preferred thickness of the p Si layer (which defines the conduction channel length) is from 10 nm to 200 nm. Also, an optional cap layer (e.g., Si) can be produced to cover the top n+ Si layer. After that, trenches are patterned (e.g., via photoresist spinning and lithography) and etched into the silicon wafer (FIG. 2b) to define silicon fins (conduction channels) and also to isolate adjacent memory groups. The detailed etching methods to define the silicon fins can include the use of hard mask such as a nitride spacer layer on top of the fins. The bottom of the trench is below the level of the lower n+ Si layer (e.g., preferably 5-500 nm below, but this depth is variable as long as the electrical isolation is good enough). For better isolation, an extra step of ion implantation with hole dopant (such as boron) can be adopted to produce a p+ layer at the bottom of the trench (before photoresist or other mask layer covering the top of the Si fin is removed); additionally, an optional layer of field oxide (not shown in FIG. 2b) can be prepared to cover the bottom of the trench, e.g., by processing steps such as blank deposition of a thick field oxide layer, chemical mechanical polishing, and then selective etching to recess the field oxide inside the trench. Subsequently, a tunneling dielectric layer such as silicon dioxide (O) is prepared by techniques such as thermal oxidation or LPCVD to coat the Si fin (FIG. 2c). In a representative embodiment, the preferred thickness of the tunneling dielectric layer is from 2 to 10 nm but it can be varied. Next, a silicon nitride layer (e.g., with a preferred thickness ranging from 5 to 50 nm, but it can be varied) is blanket deposited by techniques such as LPCVD, followed by anisotropic etching (e.g., reactive ion etching) to form a nitride spacer contacting the lower portion of the tunneling dielectric layer (FIG. 2d) and serving as the charge retention medium. Note that it is purposely designed to have the upper portion of the conduction channel not overlapping with the nitride spacer. After that, a blocking dielectric layer such as silicon dioxide (e.g., 5.5 nm thick, but the preferred thickness is from 4 to 20 nm and can be varied) is blanket deposited by techniques such as LPCVD (FIG. 2e). By this, a charge trap structure is formed at the lower part, while a conventional gate dielectric layer is formed at the upper part contacting the conduction channel. Next, a gate layer (e.g. poly-Si, TaN, or tungsten) is blanket deposited, planarized (e.g. by chemical mechanical polishing), and then selectively etched into strips to form Word Lines in rows, followed by deposition of an insulation layer to finalize the device (FIG. 2f). Here the left-side and the right-side gates of any basic NOR memory group are connected together. In an alternative configuration, these two side gates can be separated by etching back the gate on top of the Si fin, covering the device with insulation dielectrics, planarization (e.g. by chemical mechanical polishing), etching contact holes down to reach the gates, and then electrically connecting all left-side gates in a row to form a Word Line while connecting all right-side gates in the same row to form a separate Word Line.

Figure 3A:
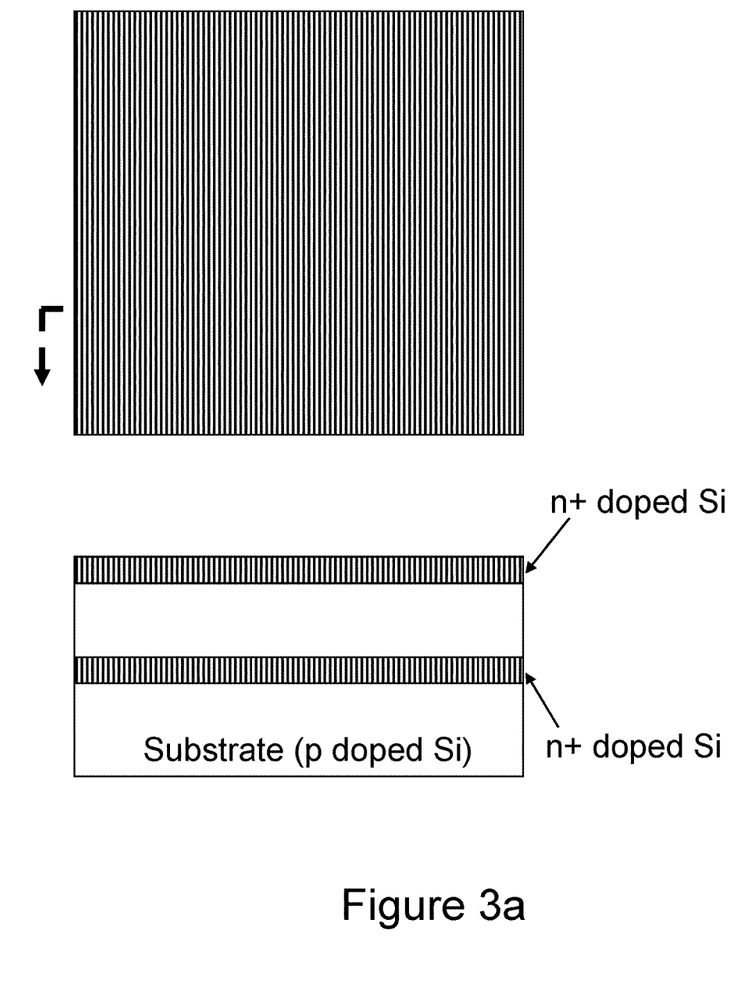
FIGS. 3a-3f show schematic diagrams of an example fabrication process for using a bulk Si wafer to implement a NOR flash memory device consisting of arrays of the basic NOR memory group of FIG. 1 but with a floating gate structure replacing the charge trap structure. The top view (upper panel) and cross-sectional view (lower panel) of the device at different fabrication stages are presented. In this design, the left-side and right-side gates of each basic NOR memory group are electrically connected.
Figure 3B:
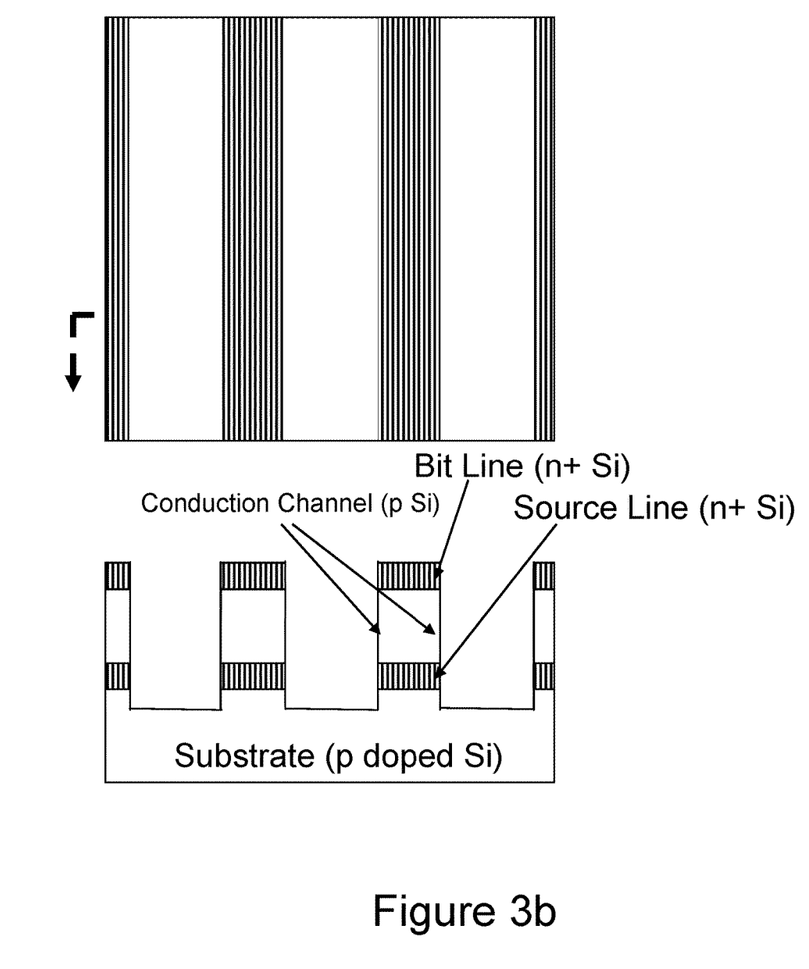
Figure 3C:
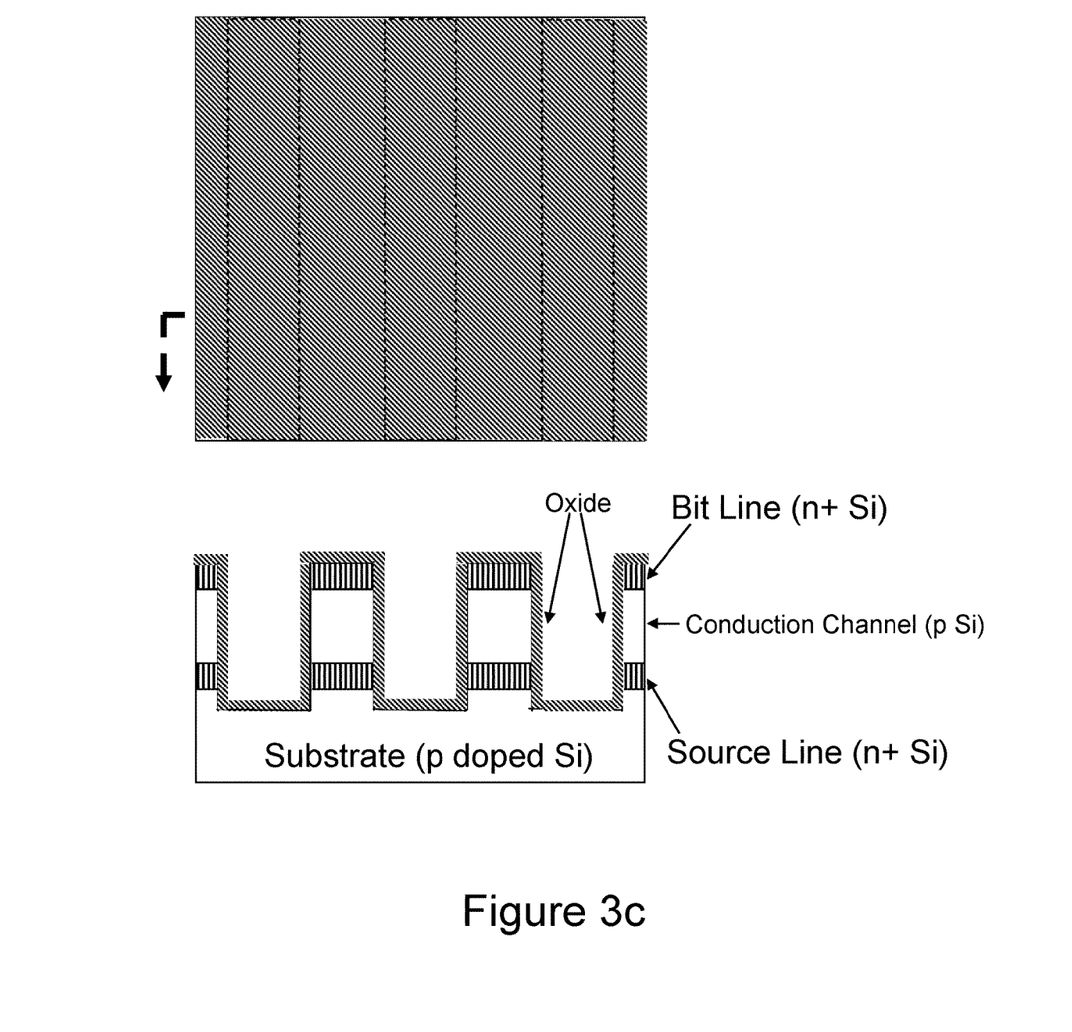
Figure 3D:
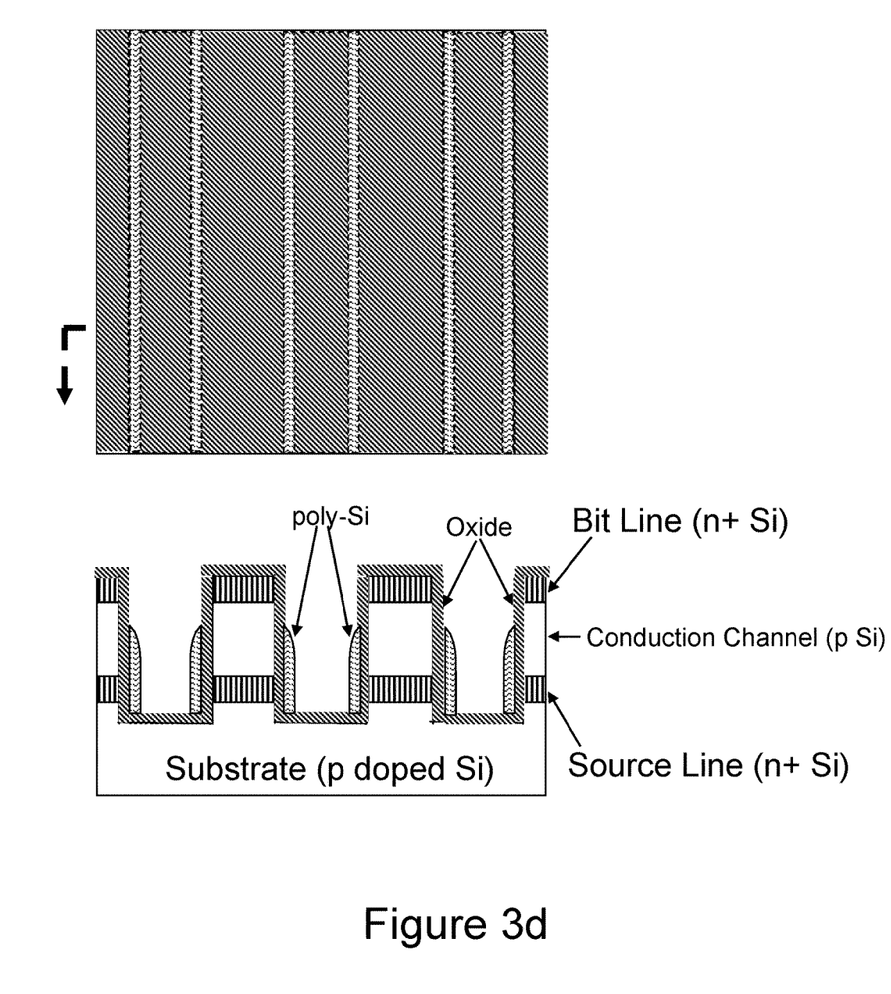
Figure 3E:
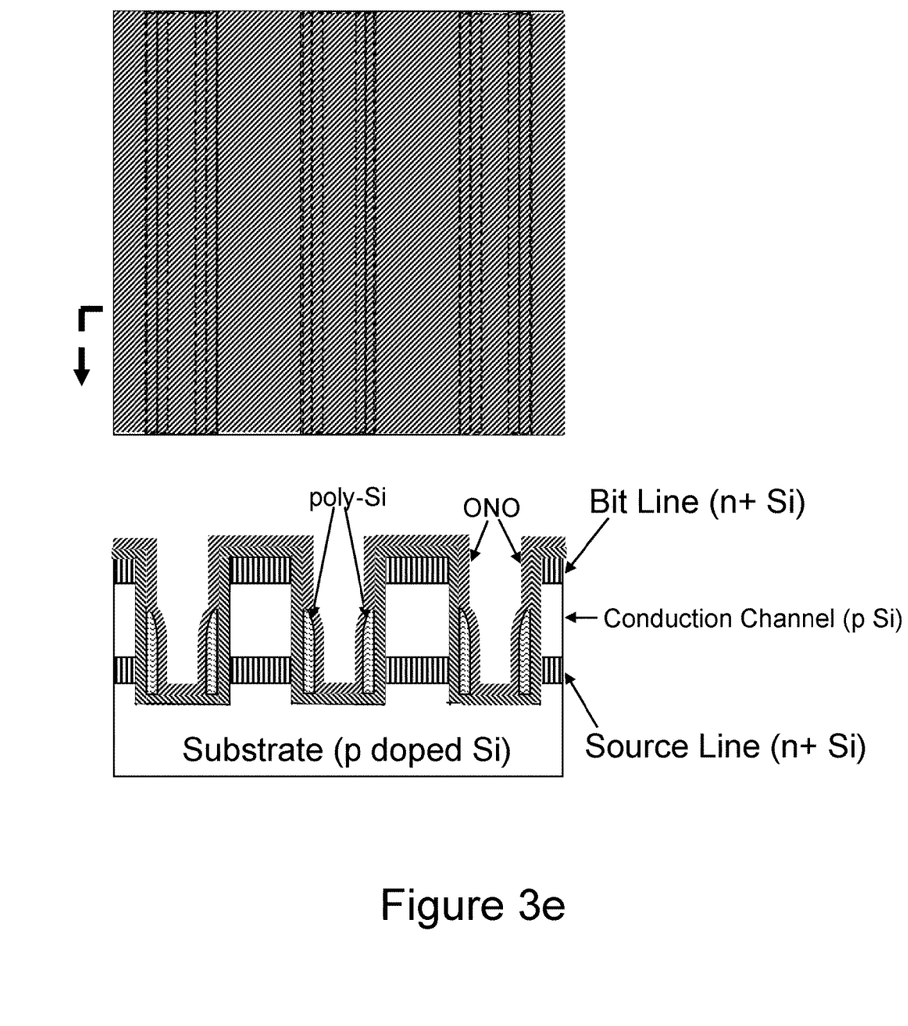
Figure 3F:
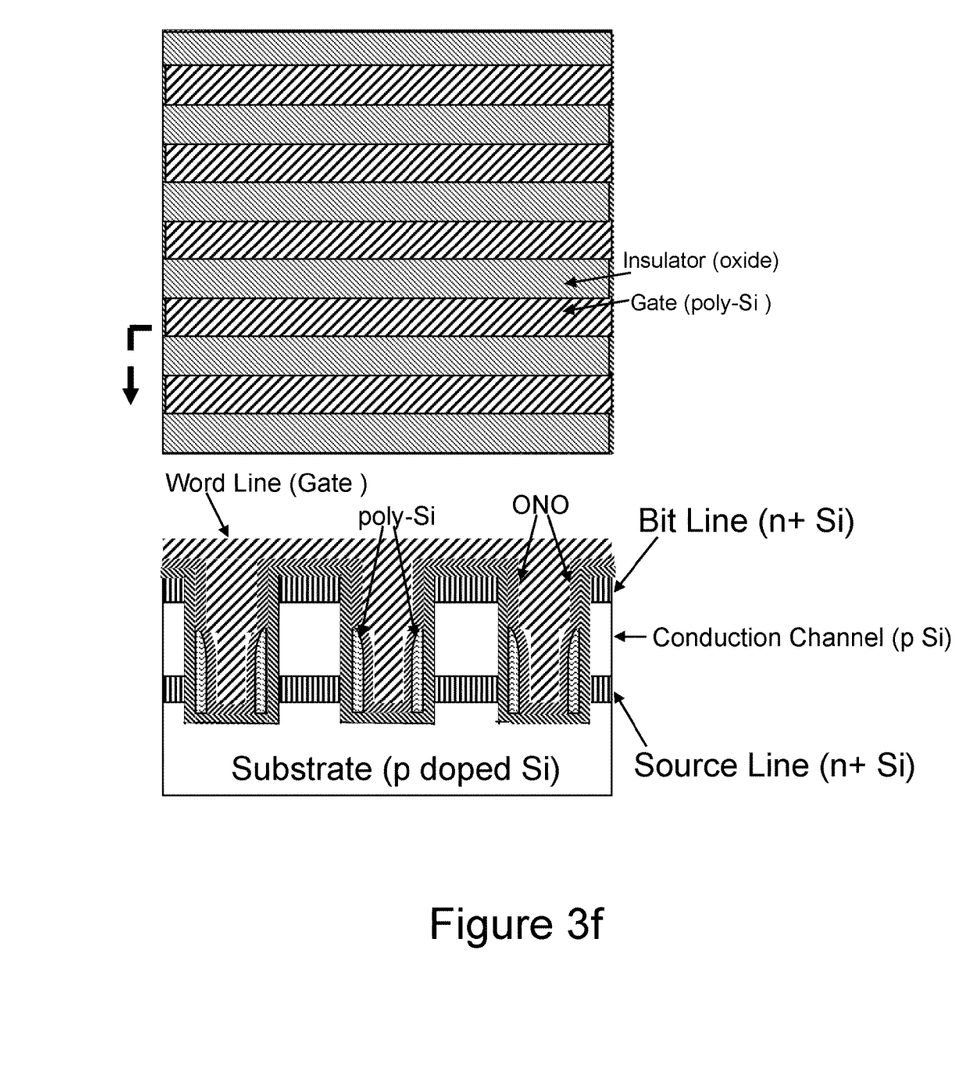

In another embodiment, the present invention comprises device fabrication methods for using a bulk Si wafer to implement a NOR flash memory device consisting of arrays of the basic NOR memory group of FIG. 1 but with a floating gate structure replacing the charge trap structure. FIGS. 3a-3f illustrate an example fabrication process using a p-doped Si wafer by modifying the previously described process flow of FIGS. 2a-2f. To start, one can follow exactly what was previously described for the processing details of FIGS. 2a and 2b, so that trenches are patterned and etched into the silicon wafer (FIGS. 3a and 3b) to define silicon fins (conduction channels) and also to isolate adjacent memory groups. Again, the bottom of the trench is below the level of the lower n+ Si layer (e.g., preferably 5-500 nm below, but this depth is variable as long as the electrical isolation is good enough). For better isolation, an extra step of ion implantation with hole dopant (such as boron) can be adopted to produce a p+ layer at the bottom of the trench (before photoresist or other mask layer covering the top of the Si fin is removed); additionally, an optional layer of field oxide (not shown in FIG. 3b) can be prepared to cover the bottom of the trench, e.g., by processing steps such as blank deposition of a thick field oxide layer, chemical mechanical polishing, and then selective etching to recess the field oxide inside the trench. Subsequently, a tunneling dielectric layer such as silicon dioxide (O) is prepared by techniques such as thermal oxidation or LPCVD to coat the Si fin (FIG. 3c). In a representative embodiment, the preferred thickness of the tunneling dielectric layer can be 2-10 nm but it can be varied. Next, a poly-Si floating gate layer (e.g., with a preferred thickness between 1 to 50 nm, but the thickness can be varied) is blanket deposited by techniques such as LPCVD, followed by anisotropic etching (e.g., reactive ion etching) to form a poly-Si spacer contacting the lower portion of the tunneling dielectric layer (FIG. 3d) and serving as the charge retention medium. Note that it is purposely designed to have the upper portion of the conduction channel not overlapping with the poly-Si spacer. After that, a blocking dielectric layer such as an ONO structure (i.e. silicon oxide/silicon nitride/silicon oxide) is blanket deposited by techniques such as LPCVD (FIG. 3e); the thickness of the ONO structure can be between 4 to 13 nm, but it is variable. By this, a poly-Si floating gate structure is formed at the lower part, while a conventional gate dielectric layer (ONO) is formed at the upper part contacting the conduction channel. Next, a gate layer (e.g. poly-Si, TaN, or tungsten) is blanket deposited, planarized (e.g. by chemical mechanical polishing), and then selectively etched into strips to form Word Lines in rows. In this step, selective etching is also applied to remove the ONO layer and the poly-Si layer in the space between the Word Line strips; followed by deposition of an insulation layer to fill this space between adjacent cells and finalize the device (FIG. 3f). Here the left-side and the right-side gates of any basic NOR memory group are connected together. In an alternative configuration, these two side gates can be separated by etching back the gate on top of the Si fin, covering the device with insulation dielectrics, planarization (e.g. by chemical mechanical polishing), etching contact holes down to reach the gates, and then electrically connecting all left-side gates in a row to form a Word Line while connecting all right-side gates in the same row to form a separate Word Line.

In other alternative embodiments of the present invention, the charge trap structure or floating gate structure of the basic NOR memory group of FIG. 1 and its aforementioned alternative embodiments can be modified so that the top of the nitride spacer or the poly-Si spacer shown in FIGS. 1-3 is positioned at a level not lower than the top of the conduction channel, e.g. by less anisotropic etching of the spacer material during the relevant fabrication step of FIGS. 2 and 3.

While the present invention has been described in terms of the above specific embodiments, those skilled in the art will recognize that modifications can be made in form and detail without departing from the spirit and scope of the invention. Accordingly all such modifications come within the purview of the present invention.

The invention claimed is:
1. A basic non-volatile memory group comprising:
(i) a substrate;
(ii) a plurality of memory cells each having
   a drain electrode,
   a source electrode,
   a conduction channel,
   a side gate,
   a gate dielectric in contact with a first part of the conduction channel and positioned between the conduction channel and the side gate, able to provide a gating effect at the first part of the conduction channel, and
   a charge-storage structure positioned between the conduction channel and the side gate, and in contact with a second part of the conduction channel,
   the memory cells being stacked on the substrate along a direction parallel to or nearly parallel to the plane of the substrate and being electrically connected in parallel by sharing the drain electrodes and the source electrodes, respectively;

(iii) a single and continuous piece of semiconductor fin providing the conduction channels for said plurality of memory cells and implementing electrical current flow along a second direction approximately perpendicular to the plane of the substrate;

(iv) the shared drain and the shared source electrodes being connected to the top and the bottom of the semiconductor fin, respectively, or vice versa;

(v) the side gates being located on respective opposite sides of the semiconductor fin; and (vi) the charge-storage structure being a side-wall sandwich structure including a tunneling dielectric layer proximate to the conduction channel, a spacer, and a blocking dielectric layer proximate to the side gate;

wherein the gate dielectric does not overlap the spacer in the first part of the conduction channel.

2. The basic memory group of claim 1, wherein the charge-storage structure is an ONO charge trap with a tunneling dielectric layer comprising silicon oxide, a charge-retention layer comprising silicon nitride, and a blocking dielectric layer comprising silicon oxide.

3. The basic memory group of claim 1, wherein the charge-storage structure is a bandgap engineered ONO charge trap with a tunneling dielectric layer comprising composite materials of sandwiched ultra-thin silicon oxide/silicon nitride/silicon oxide structure, a charge-retention spacer layer comprising silicon nitride, and a blocking dielectric layer comprising silicon oxide.

4. The basic memory group of claim 1, wherein the charge-storage structure is a dielectric multilayer comprising a sandwich structure such as $Al_2O_3$ layer/silicon nitride spacer/silicon oxide layer, or $H_fO_2$ layer/silicon nitride spacer/$H_fO_2$ layer.

5. The basic memory group of claim 1, wherein the charge-storage structure is a floating gate structure with a tunneling dielectric layer comprising silicon oxide, a charge-retention spacer layer comprising poly-Si, and a blocking dielectric layer comprising an ONO structure (i.e. silicon oxide/silicon nitride/silicon oxide).

6. The basic memory group of claim 1, wherein the semiconductor fin consists of Si, or Ge, or Si—Ge alloy.

7. The basic memory group of claim 1, wherein the semiconductor fin consists of alternating lightly/heavily doped semiconductor segments or alternating doped-semiconductor/insulator segments stacked along said direction parallel to, or nearly parallel to the plane of the substrate.

8. The basic memory group of claim 1, wherein a stored information of every individual memory cell can be read out via NOR gate logic.

9. A method of manufacturing a basic non-volatile memory group, comprising:

(i) providing a substrate;

(ii) forming a plurality of memory cells each having a drain electrode, a source electrode, a conduction channel, a side gate, a gate dielectric in contact with a first part of the conduction channel and positioned between the conduction channel and the side gate, to provide a gating effect at the first part of the conduction channel, and a charge-storage structure positioned between the conduction channel and the side gate and in contact with a second part of the conduction channel, the memory cells being stacked on the substrate along a direction parallel to or nearly parallel to the plane of the substrate and being electrically connected in parallel by sharing the drain electrodes and the source electrodes, respectively;

(iii) forming a single and continuous piece of semiconductor fin providing the conduction channels for said plurality of memory cells and implementing electrical current flow along a second direction approximately perpendicular to the plane of the substrate;

(iv) forming the shared drain and the shared source electrodes being connected to the top and the bottom of the semiconductor fin, respectively, or vice versa;

(v) the side gates being located on respective opposite sides of the semiconductor fin;

(vi) forming the gate dielectric with dielectric insulators; and (vii) forming the charge-storage structure being a side-wall sandwich structure including a tunneling dielectric layer proximate to the conduction channel, a spacer, and a blocking dielectric layer proximate to the side gate;

wherein the gate dielectric does not overlap the spacer in the first part of the conduction channel.

10. The basic memory group of claim 1 wherein the gate dielectric is in contact with the side gate.

11. The method of claim 9, comprising forming the side gate in contact with the gate dielectric.

12. A basic non-volatile memory group comprising:

(i) a substrate;

(ii) a plurality of memory cells each having a drain electrode, a source electrode, a conduction channel, a side gate, a gate dielectric positioned between the conduction channel and the side gate and in contact with a first part of the conduction channel and able to provide a gating effect at the first part of the conduction channel, and a charge-storage structure positioned between the conduction channel and the side gate, and in contact with a second part of the conduction channel, the memory cells being stacked on the substrate along a direction parallel to or nearly parallel to the plane of the substrate and being electrically connected in parallel by sharing the drain electrodes and the source electrodes, respectively;

(iii) a single and continuous piece of semiconductor fin providing the conduction channels for said plurality of memory cells and implementing electrical current flow along a second direction approximately perpendicular to the plane of the substrate;

(iv) the shared drain and the shared source electrodes being connected to the top and the bottom of the semiconductor fin, respectively, or vice versa;

(v) the side gates being located on respective opposite sides of the semiconductor fin; and (vi) the charge-storage structure being a side-wall sandwich structure including a tunneling dielectric layer proximate to the conduction channel, a spacer, and a blocking dielectric layer proximate to the side gate.

13. The basic memory group of claim 12 wherein the gate dielectric does not overlap the charge storage structure at the first part of the conduction channel.

14. The basic memory group of claim 12 wherein the gate dielectric does not overlap the spacer at the first part of the conduction channel.

15. The basic non-volatile memory group of claim 1 wherein said single and continuous piece of semiconductor fin extends along a direction parallel to or nearly parallel to the plane of the substrate.

* * * * *